United States Patent [19]

Maudsley

[11] Patent Number: 4,594,566
[45] Date of Patent: Jun. 10, 1986

[54] HIGH FREQUENCY RF COIL FOR NMR DEVICE

[75] Inventor: Andrew A. Maudsley, Boston, Mass.
[73] Assignee: Advanced NMR Systems, Inc., Woburn, Mass.
[21] Appl. No.: 646,370
[22] Filed: Aug. 30, 1984
[51] Int. Cl.$^4$ ........................... H01P 7/00; H01P 5/12
[52] U.S. Cl. ................................ 333/219; 324/307; 324/318; 333/223; 333/235
[58] Field of Search .................. 324/307-322; 333/24 R, 24 C, 32-33, 219, 222, 223, 231, 235, 245; 128/630, 653

[56] References Cited

U.S. PATENT DOCUMENTS

| | | | |
|---|---|---|---|
| 3,771,055 | 11/1973 | Anderson | 324/322 |
| 4,095,168 | 6/1978 | Hlavka | 324/322 |
| 4,284,948 | 8/1981 | Young | 324/313 |
| 4,340,862 | 7/1982 | Percival et al. | 324/309 |
| 4,361,807 | 11/1982 | Burl et al. | 324/309 |
| 4,362,933 | 12/1982 | Young et al. | 324/309 |
| 4,388,601 | 6/1983 | Sneed, Jr. et al. | 333/227 |
| 4,439,733 | 3/1984 | Hinshaw et al. | 324/322 |
| 4,443,760 | 4/1984 | Edelstein et al. | 324/309 |
| 4,467,282 | 8/1984 | Siebold | 324/309 |
| 4,506,224 | 3/1985 | Krause | 324/319 |

FOREIGN PATENT DOCUMENTS 0047065  3/1982  European Pat. Off.

OTHER PUBLICATIONS

D. I. Holt et al, "The Signal-to-Noise Ratio . . . ", Journal of Magnetic Resonance, vol. 24 (1976), pp. 71-85.
H. J. Schneider et al, "Slotted Tube Resonator . . . ", Review of Scientific Instruments, vol. 48, No. 1 (Jan. 1977), pp. 68-73.
D. W. Alderman et al, "An Efficient Decoupler Coil Design . . . ", Journal of Magnetic Resonance, vol. 36 (1979), pp. 447-451.
A. Leroy-Willig et al, (single sheet poster), presented at the Second Annual Meeting of the Society of Magnetic Resonance in Medicine, Aug. 16-19, 1983 in San Francisco.
A. Leroy-Willig et al., "The Slotted Cylinder . . . ", The Society of Magnetic Resonance in Medicine, Second Annual Meeting, Aug. 16-19, 1983, San Francisco, pp. 213-214.
I. J. Lowe et al, "A Fast Recovery Pulsed . . . ", Rev. Sci. Instrum., vol. 45, No. 5 (May 1974), pp. 631-639.
I. J. Lowe et al, "Homogeneous rf Field Delay . . . ", Rev. Sci. Instrum., vol. 48, No. 3 (Mar. 1977), pp. 268-274.
D. M. Ginsberg et al, "Optimum Geometry of Saddle . . . ", The Review of Scientific Instruments, vol. 41, No. 1 (Jan. 1970), pp. 122-123.
D. I. Holt et al, "Quadrature Detection . . . ", Magnetic Resonance in Medicine (1984), pp. 339-353.
C. N. Chen et al, "Quadrature Detection Coils . . . ", Journal of Magnetic Resonance, vol. 54 (1983), pp. 324-327.
H. Bomsdorf et al, "First NMR Head Images . . . ", Proc. of Soc. of Magnetic Resonance in Medicine, (3rd Annual Mtg., Aug. 13-17, 1984, New York), pp. 61-62.
P. Roschmann, "Ringresonator RF-Probes . . . ", Proc. of Soc. of Magnetic Resonance in Medicine, (3rd Annual Mtg., Aug. 13-17, 1984, New York), pp. 634-635.

Primary Examiner—Marvin L. Nussbaum
Attorney, Agent, or Firm—Ostrolenk, Faber, Gerb & Soffen

[57] ABSTRACT

A radio frequency (rf) coil for an NMR device is disclosed in which at least two active sections each have a ground end connected to a common potential and a drive end opposite the ground end. The rf coil also includes at least one transmission line section for coupling the drive ends of two of the active sections. The coil is tuned to a resonant frequency by a variable capacitor connected to the drive end of one of the active sections. Two active sections may be arranged opposite each other about an axis and connected by a half wavelength transmission line to provide a linearly polarized magnetic field. Four active sections may be arranged 90° apart from each other in a quadrature coil to provide a circularly polarized magnetic field. Each active section may include two wires, each connected at one end to a lower ground ring and having an opposite end adjacent an upper ground ring which provides a ground plane. The lower ground ring may have indentations for fitting around a human subject's shoulders, and inner and outer Faraday shields may have openings forming a view port through the coil.

21 Claims, 11 Drawing Figures

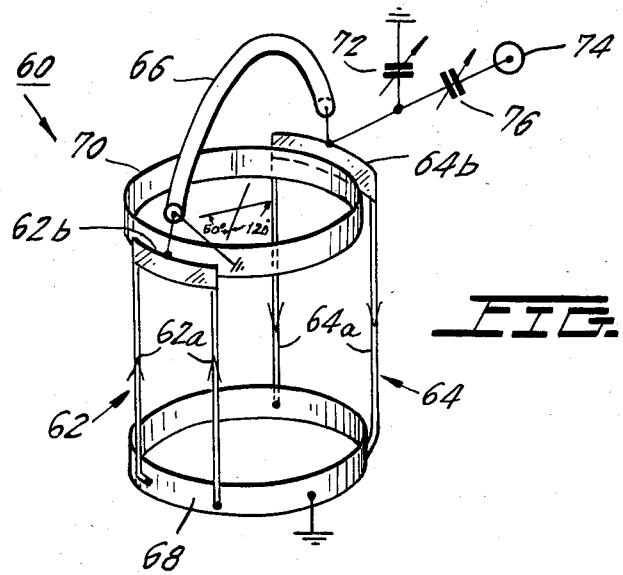
_FIG.2A._
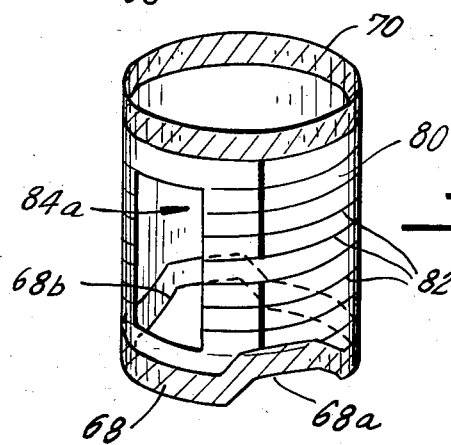
_FIG.2B._
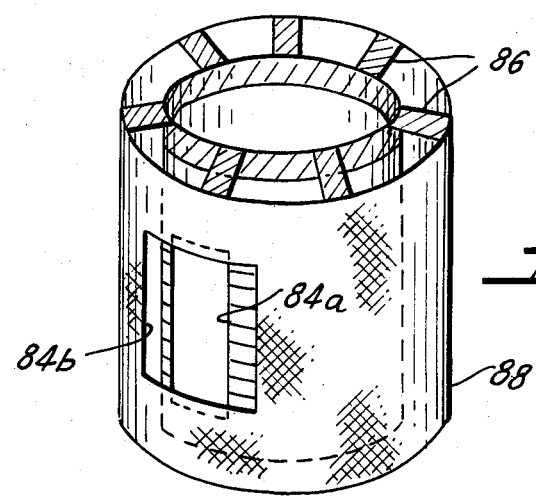
_FIG.2C._

HIGH FREQUENCY RF COIL FOR NMR DEVICE

BACKGROUND OF THE INVENTION

1. Field of the Invention

The invention relates to a coil for transmitting and receiving radio frequency (rf) electromagnetic waves for performing a nuclear magnetic resonance (NMR) study of an object. More specifically, the invention relates to a coil which is capable of transmitting or receiving high frequency rf waves and is tunable across a range of high frequencies.

2. Description of the Prior Art

In gathering NMR information about a sample, rf coils placed around the object being studied commonly perform two functions. The coils transmit rf signals into the object in order to excite its atoms, and as those atoms return to their ground state, they emit rf signals which the coils detect. The functions of transmitting and receiving may be performed by a single coil or by separate coils. In addition, in multi-nuclear studies in which the atoms of each of several elements are excited by rf waves and emit rf waves at a characteristic frequency, more than one coil may be used or a single coil may be tuned to multiple frequencies.

The two types of coils which have traditionally been used for NMR studies of an object are the simple solenoid and the saddle coil. Which coil is used will typically depend on the geometry of the structure which provides the main static magnetic field. For example, if the geometry only permits the object under study to be inserted in a direction perpendicular to the lines of flux of the main magnetic field, a solenodial coil is most efficient. This is the case when the main magnetic field is provided by a resistive or a permanent magnet. On the other hand, when the object under study is inserted in the same direction as the lines of flux, as in a superconducting magnet which has a central bore, the saddle coil must be used. In general, however, the saddle coil may be three times less efficient than the solenoid, as discussed by D. I. Hoult and R. E. Richards, "The Signal-to-Noise Ratio of the Nuclear Magnetic Resonance Experiment", *Journal of Magnetic Resonance*, Vol. 24, 1976, pp. 71–85.

A fundamental limitation on the use of the simple solenoid and saddle coils is that each becomes extremely inefficient when the length of the coil is comparable to the wavelength of its resonant frequency. Therefore, for high frequency rf signals, whose wavelengths are accordingly relatively short, the phase shift of the rf wave as it passes along the coil reduces efficiency. Furthermore, control over the tuning of the coil may be lost at high frequencies because the distributed capacitance of the coil wires becomes increasingly significant and results in a self resonant condition at a sufficiently high frequency. These effects require a trade-off between frequency and coil size—as the rf frequency becomes higher, the size of the coil must become smaller.

A number of coil designs have been proposed to overcome these limitations by providing a high frequency rf coil of greater size than would be possible with the simple solenoid or saddle coil. One proposed solution is to provide solenoidal and saddle-shaped coils having reduced inductance, which may therefore be tuned to higher frequencies. This design still requires a compromise between frequency and size and results in a less homogeneous magnetic field.

Several coil designs have been proposed based on the properties of an rf transmission line. H. J. Schneider and P. Dullenkopf, "Slotted Tube Resonator; A New NMR Probe Head at High Observing Frequencies", *Review of Scientific Instruments*, Vol. 48, No. 1, January 1977, pp. 68–73, disclosed a slotted tube resonator (STR) based upon the behavior of rf transmission lines. Variations of the STR are disclosed by D. W. Alderman and D. M. Grant, "An Efficient Decoupler Coil Design which Reduces Heating in Conductive Samples in Superconducting Spectrometers", *Journal of Magnetic Resonance*, Vol. 36, 1979, pp. 447–451 and by A. Leroy-Willig, L. Darrasse, J. Taquin and M. Sauzade, "The Slotted Cylinder, An Inductive Structure for NMR Imaging", *The Society of Magnetic Resonance in Medicine, Second Annual Meeting, Aug. 16–19, 1983*, San Francisco, pp. 213–214. I. J. Lowe and M. Engelsberg, "A Fast Recovery Pulse Nuclear Magnetic Resonance Sample Probe Using a Delay Line", Vol. 45, No. 5, May 1974, pp, 631–639 disclosed a lumped parameter delay line which behaves as a transmission line, a design which was modified in I. J. Lowe and D. W. Whitson, "Homogeneous RF Field Delay Line Probe for Pulsed Nuclear Magnetic Resonance", *Review of Scientific Instruments*, Vol. 48, No. 3, March 1977, pp. 268–274. Published European Patent Application No. 0 047 065 disclosed a distributed phase rf coil using a transmission line with alternately shielded and unshielded sections. By appropriate coupling, the coil may be driven in quadrature to generate a circularly polarized rf wave.

In general, the coil designs based on rf transmission lines are relatively complicated structures with limited or difficult tuning. The STR is especially bulky in relation to the object being studied, and includes solid materials which interfere with the switching of gradients as is necessary in NMR imaging or flow and diffusion measurement. The lumped parameter delay line is generally inefficient. The distributed phase rf coil is a fixed frequency coil, and also tends to generate undesirable electric fields.

More recently, a much simpler coil has been designed in which the two active sections of the coil are connected by two sections of transmission line to form a self-resonant loop or ringresonator. This arrangement overcomes most of the disadvantages of the previous coil designs and provides high frequency rf waves over a large volume. In order to tune this coil, however, a tuning capacitor must be provided at the center point of each section of transmission line. The use of two tuning capacitors is problematic, however, because the capacitors should be kept equal for optimum operation.

It would be advantageous to provide a still simpler rf coil design which would be more simply tuned. It would further be advantageous to provide such a coil capable of generating a circularly polarized wave.

SUMMARY OF THE INVENTION

The present invention is based on the discovery that a simple high frequency rf coil may be provided by coupling two active sections with only a single transmission line section, with the ends of the active sections opposite the transmission line being connected to ground. The invention is based upon the further discovery that the frequency of operation of the resulting arrangement may be tuned by a single tuning capacitor connected between one end of the transmission line section and ground. A second pair of active sections may be positioned in a quadrature arrangement and appropriately coupled to provide circularly polarized waves.

The rf coil of the present invention includes, therefore, at least two active sections, each of which has a ground end connected to a common potential and a drive end opposite the ground end. The drive end of each active section is connected to the drive end of at least one of the other active sections by a transmission line section connected at each end to the drive end of an active section. The active sections are thus coupled by the transmission line sections.

The rf coil of the invention, as noted above, may be tuned by a very simple circuit. The drive end of one of the active sections may be connected to a tuning circuit for tuning the resonant frequency of the rf coil. The tuning circuit may include a variable tuning capacitor connected between the drive end and ground.

The rf coil of the invention may also be coupled to an external circuit in an NMR device through a coupling circuit. The coupling circuit may simply include a variable matching capacitor connected between the drive end of one of the active sections and the external circuit.

Each active section of the rf coil of the invention may include two conductive elements such as parallel rods, each having a ground end connected to a guard ring centered on the coil axis, and each also having a drive end opposite the ground end. The rods all extend parallel to the axis, so that all of the rods lie in a cylinder at the same radial distance from the axis. Therefore, the ground ends and drive ends lie in respective circumferential rings around the cylinder. The drive ends of the active sections may be mounted around but spaced or insulated from a second guard ring defining a second ground plane. The first and second guard rings may be mounted at each end of a cylindrical inner Faraday shield which has an opening defined therein. Surrounding the active sections may be a cylindrical outer Faraday shield with a corresponding opening defined therein so that the openings in the inner and outer Faraday shield together provide a view port. Furthermore, the first guard ring may be shaped with indented sections into which the shoulders of a human being fit for imaging a human head.

As noted above, the rf coil of the invention may include two or more active sections. To transmit or receive a linearly polarized rf magnetic field, two active sections may be connected by a single transmission line whose electrical length is approximately half the wavelength of the basic resonant frequency of the coil. The two active sections may be positioned at 180° apart from each other around the axis of a cylinder. To transmit or receive a circularly polarized field, a quadrature coil including four active sections may be provided. One type of quadrature coil includes two pairs of active sections, the active sections in each pair being connected as described above. The pairs of active sections are oriented at 90° from each other. Each pair of active sections is coupled with appropriate matching and tuning capacitors, and the two pairs are driven in quadrature using a quadrature driving circuit such as a quadrature hybrid. Another quadrature coil includes four of the active sections with their center lines spaced at 90° from each other around a cylinder, with the drive ends of adjacent active sections being connected by quadrature transmission line sections. The quadrature transmission line sections are approximately one fourth the wavelength of the resonant frequency. Two adjacent active sections are connected to a quadrature driving circuit to be driven in quadrature.

Other objects, features and advantages of the invention will be apparent from the following description, together with the accompanying drawings and the appended claims.

BRIEF DESCRIPTION OF THE DRAWINGS

FIG. 2A shows one embodiment of an rf coil according to the present invention.

FIG. 2B shows an arrangement of guard rings and an inner Faraday shield for use in the rf coil of the present invention.

FIG. 2C shows an outer Faraday shield connected to the arrangement of FIG. 2B.

DETAILED DESCRIPTION OF THE PREFERRED EMBODIMENTS

I. General Description

The present invention may be understood most easily by comparing FIGS. 1A–1D with FIGS. 2A–2C. FIGS. 1A–1D illustrate a prior art self-resonant rf coil, while FIGS. 2A–2C illustrate one embodiment of the rf coil of the present invention.

Figure 1A:
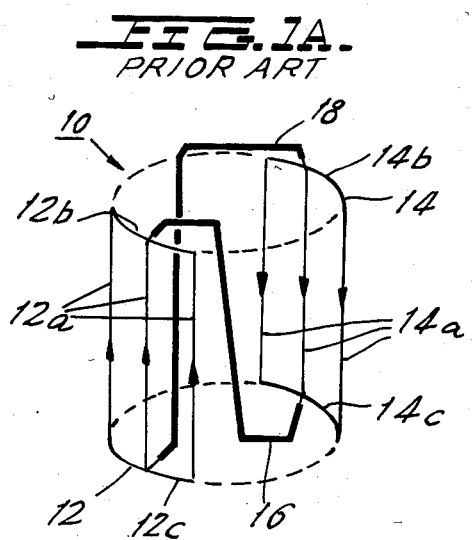
FIG. 1A shows the active sections and transmission lines of a previous rf coil.

As shown in FIG. 1A, rf coil 10 includes active sections 12 and 14, each including three symmetrically spaced parallel conductors 12a, 14a. The conductors 12a, 14a of each of the active sections 12, 14 are positioned on the periphery of an imaginary cylinder, shown in dashed outline, but the centers of active sections 12, 14 are spaced apart from each other by 180° around the circumference of the cylinder. The upper ends 12b and 14b of the active sections 12, 14 fall on a circle around the perimeter of the cylinder, while the lower ends 12c and 14c fall on another circle around the perimeter. The upper and lower ends 12b, 12c, 14b, 14c may also be suitable conductors. Upper end 12b of active section 12 is connected to lower end 14c of active section 14 by transmission lines section 16, while lower end 12c is connected to upper end 14b by transmission line section 18. Transmission line sections 16 and 18 are one-half wavelength of the rf frequency employed, to provide a self-resonant ring with an electrical length of one wavelength. In addition, rf coil 10 will be equipped with tuning circuitry and coupling circuitry as discussed in relation to FIG. 1B below.

Figure 1C:
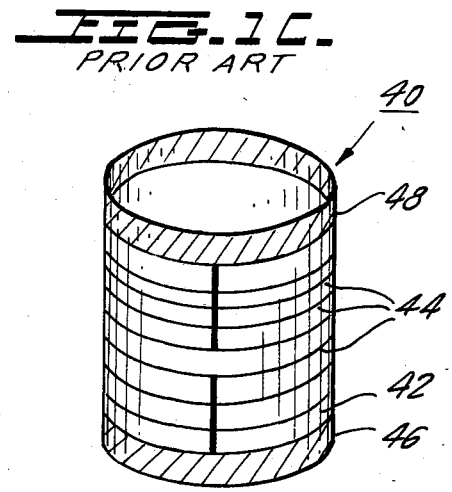
FIG. 1C shows guard rings and the inner Faraday shield used with the previous rf coils of FIGS. 1A and 1B.
Figure 1B:
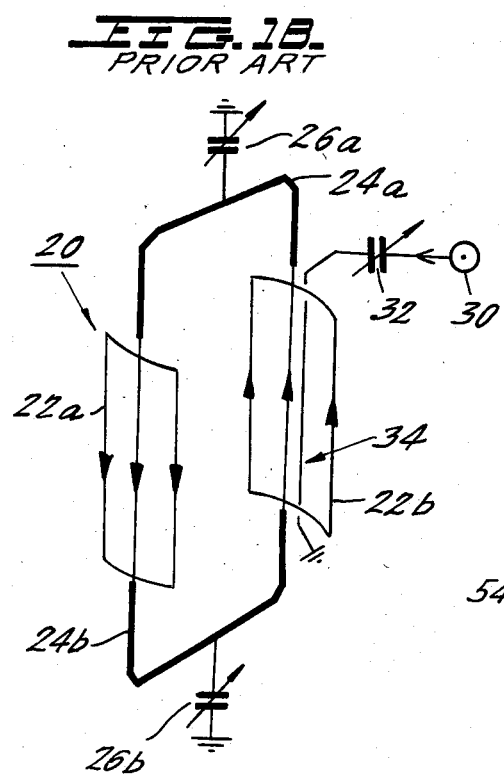
FIG. 1B is a schematic drawing showing another previous rf coil resembling FIG. 1A, together with additional circuitry.

FIG. 1B shows another rf coil 20 which similarly includes active sections 22a and 22b connected by transmission line sections 24a and 24b. Transmission line sections 24a and 24b, however, are one wavelength rather than one-half wavelength as in rf coil 10, above, so that the self-resonant ring has an electrical length of two wavelengths. A respective tuning capacitor 26a, 26b is connected at the midpoint of each of transmission line sections 24a and 24b, and the adjustment of capacitors 26a and 26b alters the phase delay along each of the transmission line sections 24a and 24b. As noted above, however, tuning capacitors 26a and 26b should be kept equal for optimal operation. The external node 30 permits connection to an external circuit which interacts with the coil through matching capacitor 32 and inductive coupling wire 34 mounted adjacent the center conductor of active section 22b. As shown, coupling wire 34 is grounded at its other end.

When the tuning capacitors in rf coil 10 and 20 are properly adjusted, the current in the active sections of each coil will be in opposite directions, as shown. As a result, rf coils 10 and 12 will cause a magnetic field closely resembling that caused by a saddle coil. The resulting circuit, however, will resonate at a high frequency for transmitting or receiving a high frequency rf field.

As described above, the present invention is based on a discovery that only one transmission line section is necessary between the two active sections of an rf coil. As shown in FIG. 2A, rf coil 60, one embodiment of the present invention, includes active sections 62 and 64, each including conductive elements 62a, 64a. Active sections 62 and 64 are each driven at their respective drive ends 62b and 64b, which are coupled to each other by transmission line section 66.

Transmission line section 66 is preferably a length of high quality coaxial cable, or other shielded conductor and may be approximately half the wavelength of the resonant frequency, or it may be any odd integer multiple of the half wavelength in the simple embodiment shown. Transmission line section 66 should be shielded to prevent stray radiation which would cause spurious signals. As discussed below in relation to FIG. 5, the outer conductor of a coaxial cable may be grounded to provide this shielding. The coaxial cable should preferably be of the high voltage low loss type, such as 50 ohm low loss cable.

At their ends opposite drive ends 62b, 64b, conductors 62a, 64a are connected to a common potential, by a connection to a conductive guard ring 68, as shown. Another conducting guard ring 70 is positioned adjacent drive ends 62b, 64b to provide a second plane at the common potential. Although guard rings 68, 70 could float at a common potential, they are preferably connected to ground for safety reasons. To properly maintain a common potential, guard rings 68, 70 must have low resistance at high frequencies, but may have high resistance at low frequencies. For example, guard rings 68, 70 may be thin brass strips formed into rings.

As shown in FIG. 2A, each active section 62, 64 may include two parallel conductors 62a and 64a, which may be rods, and the rods of each active section are spaced apart from each other around the circumference of the cylinder defined generally by guard rings 68 and 70 by 60°. Since active section 62 is centered 180° apart from active section 64, each rod of each active section 62 or 64 is also spaced apart from the adjacent rod of the other active section 62 or 64 by 120°. This spacing is chosen to obtain optimum field homogeneity, as discussed in D. M. Ginsberg and M. J. Melchner, "Optimum Geometry of Saddle-Shaped Coils for Generating a Uniform Magnetic Field", *Review of Scientific Instruments*, Vol. 41, No. 1, January, 1970, pp. 122-123. As further indicated in that article, the lengths of conductors 62a and 64a may be varied about a range to obtain an optimal trade-off between homogeneity and inductance. If an elliptical region of high homogeneity is desired, conductors 62a, 64a may have a length approximately equal to the coil diameter. The resulting magnetic field produced by rf coil 60 will be linearly polarized.

In the cylindrical coil 60 of FIG. 2A, conductors 62a, 64a are all rods or the like on a cylinder, and may, for example, be held in position by being supported on a cylindrical coil former (not shown) made of an insulating material. Many alternative geometries are within the scope of the invention, however. Active sections 62, 64 may each include more than two rod-like conductors 62a, 64a, or may each include a single foil sheet or copper mesh conductor or other conductor covering the desired angle and having a low resistance at high frequencies. Since the signal on the active sections 62, 64 is at a high frequency, its conduction will largely be by skin effect conductivity, so that hollow rods are suitable. Compared to rods, a foil sheet will produce a more homogenous field, but will be less efficient. By positioning a foil sheet or other conductor on an elliptical coil former, an elliptical coil may be obtained. Other variations are possible, but in all cases only one transmission line section connecting active sections will be necessary.

As described above, the present invention is also based on the discovery that rf coil 60 can be tuned through variable tuning capacitor 72 connected between drive end 64b of active section 64 and ground. Surprisingly, the adjustment of the resonant frequency of rf coil 60 over a limited range using tuning capacitor 72 does not change the field distribution produced by the coil. For example, if transmission line 66 is a half wavelength section at a particular frequency, rf coil 60 may be tuned across a limited range of frequencies about that particular frequency despite the different wavelengths of the frequencies. In practice, using a coil which would be resonant at 87 MHz without tuning capacitor 72, the field distribution at 79 MHz, tuned using capacitor 72, was similar to within 0.2 dB of the field distribution at 87 MHz over one half the diameter of the coil, and within 1.0 dB over 66 percent of the diameter of the coil. These variations are smaller than the range of error encountered during the measurement process itself. Therefore, the high frequency rf coil according to the invention is readily tunable across a limited range of frequencies.

FIG. 2A also illustrates a direct coupling to an external node 74 for connection to an external circuit. As shown, drive end 64b is connected directly through variable matching capacitor 76 to external node 74. By adjusting matching capacitor 76, the impedance of rf coil 60 may be matched to the external circuit which transmits or receives through rf coil 60.

Figure 1D:
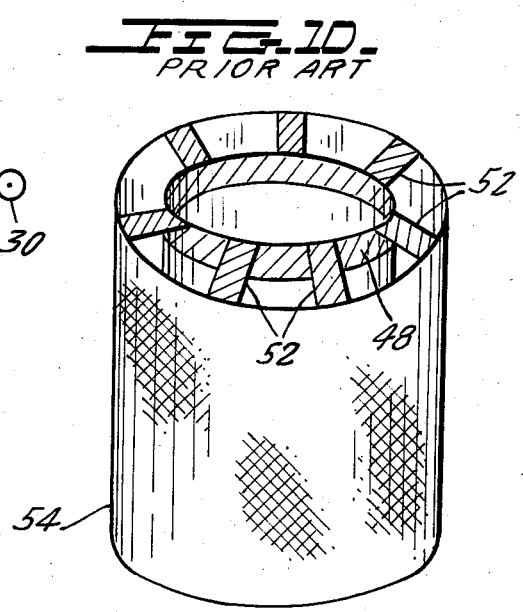
FIG. 1D shows an outer Faraday shield connected to the inner Faraday shield of FIG. 1C.

As shown in FIG. 1C, the previous rf coil 10 and 20 have typically been mounted around an inner shielding structure 40. Structure 40 includes a generally cylindrical coil former 42 made, for example, of plastic, on which a Faraday shield 44 is formed, as by mounting copper strips on coil former 42. Faraday shield 44 functions to reduce electric field strength inside the coil and also isolates the coil from the object being studied, so that the object does not affect the tuning of the coil. Conducting guard rings 46 and 48 at the ends of coil former 42 provide ground planes. External shielding has been provided as shown in FIG. 1D by connecting an outer Faraday shield 54, which may be a cylinder of copper or brass mesh, to guard ring 48 through conductive strips 52. Outer Faraday shield 54, spaced a short distance from the coil, also provides a fixed ground plane, improving the stability and efficiency of the coil.

The coil of the present invention, as shown in FIGS. 2B and 2C may have a somewhat different shielding arrangement. For performing NMR imaging of the head, for example, guard ring 68, rather than being a perfect ring, preferably has indented sections 68a and 68b defined therein, so that the head of a human subject may be placed within the coil and the subject's shoulders may fit into the indented sections 68a, 68b. Coil former 80 has inner Faraday shield 82 mounted on it and also has an opening 84a cut out of it to permit the subject to see out of the coil. This is especially important for claustrophobic subjects, but generally results in greater comfort for the subject. In addition, the opening 84a may be used for viewing the subject being studied from outside the coil by means of a silvered mirror mounted at a 45° inclination outside the view port, for example. In order to permit an unobstructed view, outer Faraday shield 88 which is connected to guard ring 70 by conducting strips 86, has a corresponding opening 84b defined in it and aligned outward from opening 84a in coil former 80.

The rf coil of the invention thus provides an easily tuned high frequency coil which has an extremely simple structure. In addition, the rf coil of the invention, due to its ease of tuning it and structure, may take a more complicated form, as discussed below.

II. Quadrature Coil Embodiments

Figure 3A:
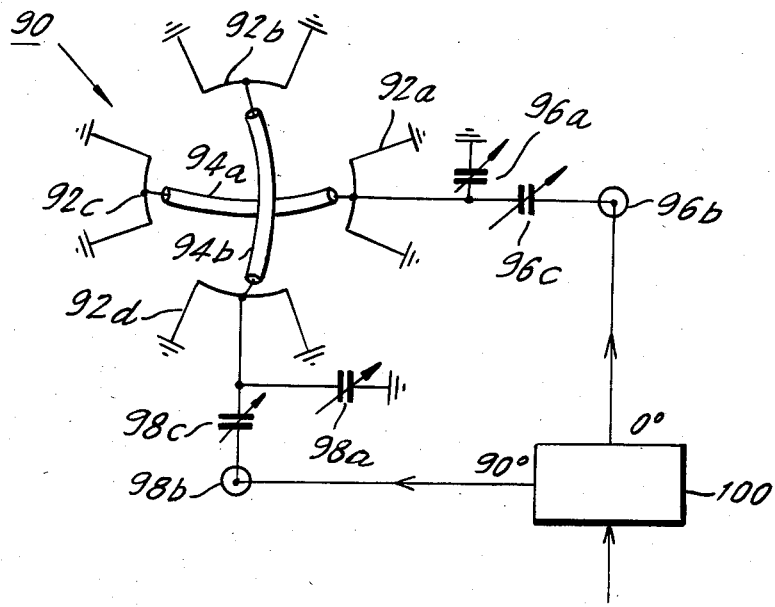
FIG. 3A is a schematic drawing illustrating the arrangement and connections of a quadrature coil embodiment of the present invention.
Figure 3B:
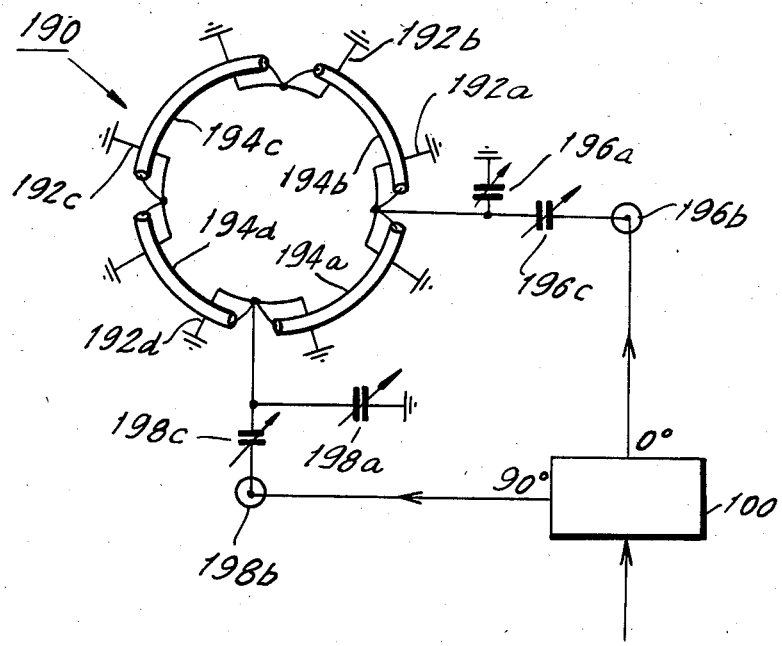
FIG. 3B is a schematic drawing of an alternative quadrature coil embodiment of the present invention.

The basic embodiment of the invention described in relation to FIGS. 2A-2C produces a linearly polarized rf magnetic field. It is often useful, however, in the study of an object using NMR to apply a circularly polarized rf field. FIGS. 3A and 3B illustrate two quadrature coils for generating circularly polarized rf fields according to the invention.

As shown in FIG. 3A, the first quadrature coil 90 according to the invention includes two pairs of active sections each arranged in the same manner as rf coil 60 shown in FIG. 2A. The two pairs are positioned at a 90° angle from each other, however, so that the active sections 92a-92d are centered on lines spaced at 90° intervals measured from the axis of a cylinder, each center line being parallel to the axis. The active sections 92a and 92c of the first pair, are coupled to each other by transmission line section 94a. The drive end of active section 92a is also connected through tuning capacitor 96a to ground and is connected to external node 96b through variable matching capacitor 96c. The active sections 92b and 92d of the second pair are connected to each other through transmission line section 94b. The drive end of active section 92d is similarly connected through tuning capacitor 98a to ground and is connected to external node 98b through variable matching capacitor 98c. Nodes 96b and 98b are coupled to respective terminals of quadrature circuit 100, for transmitting or receiving signals at the resonant frequency but 90° out of phase.

Figure 4:
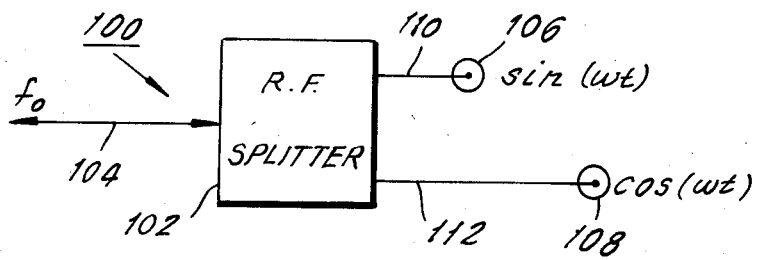
FIG. 4 is a schematic drawing of a circuit for providing signals for driving a quadrature coil embodiment of the invention.

Quadrature driving circuit 100 may be any appropriate circuit for transmitting and receiving the necessary phase split signals, and may, for example, transmit or receive the sine and cosine functions of a waveform. D. I. Hoult, C. N. Chen and V. J. Sank, "Quadrature Detection in the Laboratory Frame", *Magnetic Resonance in Medicine*, Vol. 1, 1984, pp. 339–353, disclose a quadrature hybrid for such signals. FIG. 4 shows another quadrature circuit 100 which may be used. RF splitter, a standard component, couples waveform 104 with two quadrature waveforms of equal amplitude and phase. These two waveforms are coupled to nodes 106, 108, which may be nodes 96b, 98b, through delay sections 110, 112, respectively. Delay sections 110, 112 are transmission lines such as coaxial cables which differ in length by one-quarter wavelength at the operating frequency, so that the quadrature signal at node 108 is delayed by 90° from that at node 106. Thus, the quadrature signals are related as sine and cosine.

FIG. 3B illustrates an alternative quadrature coil 190, including active sections 192a-192d. As in quadrature coil 90, the four active sections 192a-192d of quadrature coil 190 are centered on lines spaced at 90° intervals around a cylinder and parallel to its axis. Therefore, each active section is between two adjacent active sections, and the drive end of each active section is connected to the drive end of each adjacent active section by a corresponding one of quadrature transmission line sections 194a-194d. As shown, the drive ends of active sections 192a, 192d are also connected respectively through variable tuning capacitors 196a, 198a to ground and to external nodes 196b, 198b through variable matching capacitors 196c, 198c. As discussed above, nodes 196b, 198b are coupled to quadrature driving circuit 100 which provides signals out of phase by 90°. Interconnecting transmission line sections 194a-194d may be quarter wavelength coaxial cables.

Figure 5:
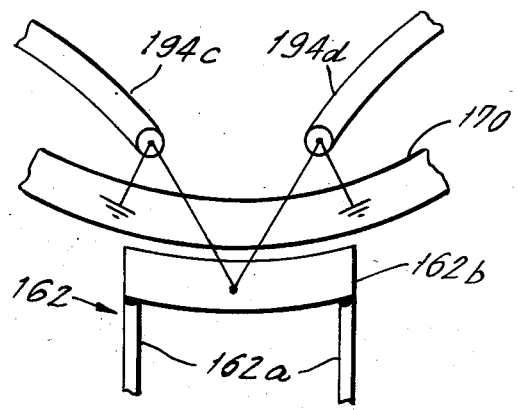
FIG. 5 shows a coupling arrangement utilizing quadrature transmission line section.

FIG. 5 shows how quadrature transmission line sections 194c, 194d, for example, may be connected to guard ring 170 and the drive end 162b of active section 162, with conductors 162a. The inner conductor of each coaxial cable 194c, 194d connects to drive end 162b, while the outer shielding section connects to guard ring 170.

As is well known, the use of a quadrature coil is substantially more efficient in NMR processes because it provides a greater magnetic field for the same amount of input power. See, for example, C.-N. Chen, D. I. Hoult, and V. J. Sank, "Quadrature Detection Coils—A Further √2 Improvement in Sensitivity", *Journal of Magnetic Resonance*, Vol. 54, 1983, pp. 324–327.

Although the invention has been described in connection with a plurality of preferred embodiments thereof, many other variations and and modifications will now become apparent to those skilled in the art. It is preferred, therefore, that the present invention be limited not by the specific disclosure herein, but only by the appended claims.

What is claimed is:

1. An rf coil for an NMR device, the coil being tuneable to at least one resonant frequency and comprising:
    at least two active sections, the active sections all being substantially parallel to an axis, each active section having a drive end and a ground end that is connected to a common potential, each drive end being situated in a first region and each ground end being situated in a second region, the first and second regions being spaced from each other along the axis, each active section comprising at least one conductive element extending between the drive end and the ground end; and a connecting circuit connected between the drive ends of the active sections, each active section being coupled by the connecting circuit to at least one of the other active sections, the connecting circuit maintaining a phase difference of approximately one-half wavelength between the drive ends of two of the active elements at a, tuned resonant frequency.

2. The rf coil of claim 1, further comprising a coupling circuit connected between the drive end of one of the active sections and means for coupling to an NMR device.

3. The rf coil of claim 2 in which the coupling circuit comprises a matching means for matching the impedance of the rf coil to the NMR device.

4. The rf coil of claim 3 in which the matching means comprises a capacitor.

5. The rf coil of claim 1 further comprising a tuning circuit connected to the drive end of one of the active sections for tuning the rf coil to the timed resonant frequency.

6. The rf coil of claim 5 in which the tuning circuit comprises a variable capacitor connected between the drive end to which the tuning circuit is connected and ground.

7. The rf coil of claim 1, wherein the conductive elements of the active sections all extend in a direction parallel to the axis and all are spaced from the axis by a single radial distance, whereby the conductive elements all lie in a cylinder centered on the axis.

8. The rf coil of claim 7 in which the first region comprises a first circumferential ring around the cylinder and the second region comprises a second circumferential ring around the cylinder.

9. The rf coil of claim 7 in which each active section comprises first and second spaced apart ones of the conductive elements, the first and second conductive elements of each active section being spaced apart from each other around the cylinder by a single angle measured from the axis.

10. The rf coil of claim 9 in which the single angle produces a magnetic field of optimal homogeneity within the rf coil.

11. The rf coil of claim 9 comprising first and second ones of the active sections, the first and second active sections being opposite each other about the axis, the first conductive element of each of the first and second active sections being spaced apart from the second conductive element of the other of the first and second active sections around the cylinder by an angle which produces a magnetic field of optimal homogeneity within the rf coil.

12. The rf coil of claim 7 further having a basic resonant frequency and comprising first and second ones of the active sections, the first and second active sections being opposite each other about the axis, the transmission line section connecting the drive ends of the first and second active sections being approximately equal in length to one half the wavelength of a wave traveling along the transmission line section at the basic resonant frequency.

13. The rf coil of claim 12, additionally comprising a further coupling circuit connected to the drive end of the first active section and adapted to be connected to an NMR device for coupling the NMR device with a linearly polarized magnetic field through the rf coil.

14. The rf coil of claim 7 comprising four of the active sections, the four active sections being adjacent and each being centered about a respective center line on the cylinder parallel to the axis, the center lines of adjacent ones of the active sections being spaced from each other around the cylinder by angular intervals of 90° measured from the axis.

15. The rf coil of claim 14, additionally comprising further first and second coupling circuits connected respectively to the drive ends of first and second adjacent ones of the four active sections, the first and second coupling circuits being connected to a quadrature circuit for coupling with a circularly polarized magnetic field through the rf coil.

16. The rf coil of claim 14 in which the four active sections include first and second pairs of opposite active sections, the rf coil further having a basic resonant frequency and comprising first and second transmission line sections, the first and second transmission line sections each comprising a half wavelength section connected between the drive ends of the active sections of a respective one of the first and second pairs, each of the half wavelength sections being approximately equal in length to one half of the wavelength of a wave traveling along that transmission line section at the basic resonant frequency.

17. The rf coil of claim 14 having a basic resonant frequency and comprising four of the transmission line sections, the active sections being adjacent each other around the cylinder, each of the transmission line sections being connected between two adjacent ones of the active sections, each of the transmission line sections being approximately equal in length to one fourth the wavelength of a wave traveling along that transmission line section at the basic resonant frequency.

18. The rf coil of claim 7 further comprising a first ground ring centered on the axis and connected to the ground ends of all of the active sections for connecting the ground ends to the common potential, the rf coil further comprising a second ground ring centered on the axis and connected to the common potential, the second ground ring being positioned inside the drive ends of the active sections for defining a ground plane.

19. The rf coil of claim 18 in which each transmission line section comprises a shielding conductor, the shielding conductor being connected to the second ground ring.

20. The rf coil of claim 18 further comprising a generally cylindrical inner Faraday shield beween the first and second ground rings, the inner Faraday shield having a first opening defined therein, the rf coil further comprising a generally cylindrical outer Faraday shield disposed around the active elements and connected to at least one of the first and second ground rings, the outer Faraday shield having a second opening defined therein, the first and second openings being aligned for providing a view port.

21. The rf coil of claim 18 in which the first ground ring has two indented sections defined therein for fitting around the shoulders of a human subject.

* * * * *